United States Patent [19]
Poimboeuf et al.

[11] Patent Number: 5,825,238
[45] Date of Patent: Oct. 20, 1998

[54] CIRCUIT FOR FILTERING A POWER SUPPLY FOR NOISE SENSITIVE DEVICES

[75] Inventors: Michael K. Poimboeuf, San Mateo; Jeff DiNapoli, San Carlos; Gerald L. Brainard, San Jose, all of Calif.

[73] Assignee: Silicon Graphics, Inc., Mountain View, Calif.

[21] Appl. No.: 788,369

[22] Filed: Jan. 27, 1997

[51] Int. Cl.$^6$ ..................................................... H03B 1/00
[52] U.S. Cl. ........................ 327/552; 327/532; 327/538; 327/558
[58] Field of Search ................................. 327/532, 538, 327/540, 541, 543, 553, 558, 552

[56] References Cited

U.S. PATENT DOCUMENTS

| | | | |
|---|---|---|---|
| 3,755,749 | 8/1973 | Van Ryswyk et al. | 328/167 |
| 3,755,750 | 8/1973 | Heberling | 327/167 |
| 5,568,960 | 10/1996 | Oleson et al. | 297/344.22 |

*Primary Examiner*—Timothy P. Callahan
*Assistant Examiner*—Jung Ho Kim
*Attorney, Agent, or Firm*—Wagner, Murabito & Hao

[57] ABSTRACT

The present invention comprises an active shunt filter for filtering a power supply for noise sensitive devices. The active shunt filter includes a transistor and an op amp. A first resistor is coupled between the emitter of the transistor and a first power supply. A second resistor is coupled between the collector of the transistor and a ground. A third resistor is coupled between the base of the transistor and the output of the op amp. The output of the op amp controls the impedance of the transistor. The op amp is coupled to receive power from a second power supply. The negative input of the op amp is coupled to the emitter. The positive input of the op amp is coupled to the first power supply via a fourth resistor. A fifth resistor couples the positive input of the op amp to ground. A capacitor is also coupled between the positive input of the op amp and ground. The op amp controls a shunt current flowing from the first power supply to ground via the transistor to produce a filtered power output for a noise sensitive device at the emitter of the transistor.

8 Claims, 4 Drawing Sheets

CIRCUIT FOR FILTERING A POWER SUPPLY FOR NOISE SENSITIVE DEVICES

FIELD OF THE INVENTION

The field of the present invention involves analog signal noise filtering. More particularly, the present invention pertains to a circuit for filtering power supply noise in power supplies coupled to noise sensitive devices.

BACKGROUND OF THE INVENTION

Many electronic circuit devices exhibit noise sensitivity on their power supply inputs. Some electronic circuit devices are more sensitive to such noise than others. In many circuit applications, it is very important that signals created by the applications are as noise free as possible. PLLs (Phase Locked Loops) are one of many such applications.

PLL circuits typically receive power from voltage regulated power supplies. A PLL is sensitive to power supply voltage noise at frequencies close to its natural frequency. Power supply noise, and especially noise at the natural frequency of the PLL, can be very detrimental to the signal quality of the PLL. Thus, the power supplies coupled to PLLs are filtered.

Prior art FIG. 1 shows a typical prior art cascaded capacitor filter 100 widely used in the electronics industry. The cascaded capacitor filter 100 includes a plurality of capacitors linked in parallel, each capacitor an order of magnitude different each other. Thus, for example, capacitor 101 is 10 $\mu$F, capacitor 102 is 1 $\mu$F, capacitor 103 is 0.1 $\mu$F, so on such that the smaller capacitor 104 is 1000$_p$F, capacitor 105 is 100$_p$F, and capacitor 106 is 10$_p$F.

The cascaded capacitor filter 100 is used to filter the power supplied to a PLL or other noise sensitive device. The cascaded capacitor filter 100 is designed to minimize the amount of power supply noise around the natural frequency of the device. This can be difficult due to the fact that in many cases, the natural frequency is very low. To effectively filter low frequency power supply noise, very large capacitors are required. Thus, capacitor 101, the largest capacitor in cascaded capacitor filter 100, is too large to easily fit within the space constraints of many modern circuit boards. Capacitor 101 displaces other circuitry by consuming an inordinate amount of circuit board area. In addition to size disadvantages, capacitor 101 has higher parasitic inductance and higher parasitic resistance. The large capacitors 101, 102, and 103 also have lower self resonance frequencies which limit their effectiveness by degrading the filtering performance of cascaded capacitor filter 100 above their self resonance frequencies.

Thus, what is required is a circuit for filtering a power supply for noise sensitive devices which overcomes the limitations of the prior art. The required solution should not require the use of large capacitors in order to filter out low frequency noise. The required solution should not consume a large amount of circuit board space. The required solution should provide a greater amount of attenuation at the natural frequencies of noise sensitive devices than prior art cascaded capacitor filters. In addition, the required solution should provide noise attenuation at higher frequencies than can be affected by conventional direct current (DC) regulators, while not requiring DC reregulation.

SUMMARY OF THE INVENTION

The present invention comprises an active shunt filter for filtering a power supply for noise sensitive devices. The active shunt filter includes a transistor and an op amp. A first resistor is coupled between the emitter of the transistor and a first power supply. A second resistor is coupled between the collector of the transistor and a ground. A third resistor is coupled between the base of the transistor and the output of the op amp. The output of the op amp controls the impedance of the transistor. The op amp is coupled to receive power from a second power supply. The negative input of the op amp is coupled to the emitter. The positive input of the op amp is coupled to the first power supply via a fourth resistor. A fifth resistor couples the positive input of the op amp to ground. A capacitor is also coupled between the positive input of the op amp and ground. The op amp controls a shunt current flowing from the first power supply to ground via the transistor to produce a filtered power output for a noise sensitive device at the emitter of the transistor.

In so doing, the present invention provides a circuit for filtering a power supply for noise sensitive devices which overcomes the limitations of the prior art. The active shunt filter of the present invention does not require the use of large capacitors in order to filter out low frequency noise. The active shunt filter does not consume a large amount of circuit board space. The active shunt filter of the present invention provides a greater amount of attenuation at the natural frequencies of noise sensitive devices than prior art cascaded capacitor filters. In addition, the active shunt filter provides noise attenuation at higher frequencies than can be affected by conventional DC regulators, while not requiring DC reregulation.

BRIEF DESCRIPTION OF THE DRAWINGS

The present invention is illustrated by way of example and not by way of limitation, in the figures of the accompanying drawings and in which like reference numerals refer to similar elements and in which.

Prior art

DETAILED DESCRIPTION OF THE INVENTION

A novel circuit for filtering a power supply for noise sensitive devices (e.g., PLLs) is disclosed. In the following description, for the purposes of explanation, numerous specific details are set forth in order to provide a thorough understanding of the present invention. It will be obvious, however, to one skilled in the art that the present invention may be practiced without these specific details. In other instances, well-known structures, devices, and processes are shown in block diagram form in order to avoid unnecessarily obscuring the present invention.

Figure 1:
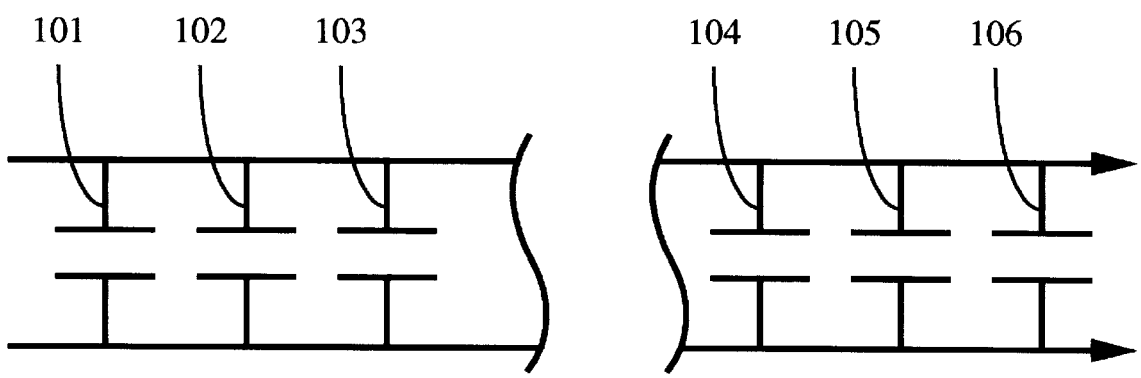
FIG. 1 shows a typical prior art cascaded capacitor filter widely used in the electronics industry.
Figure 2:
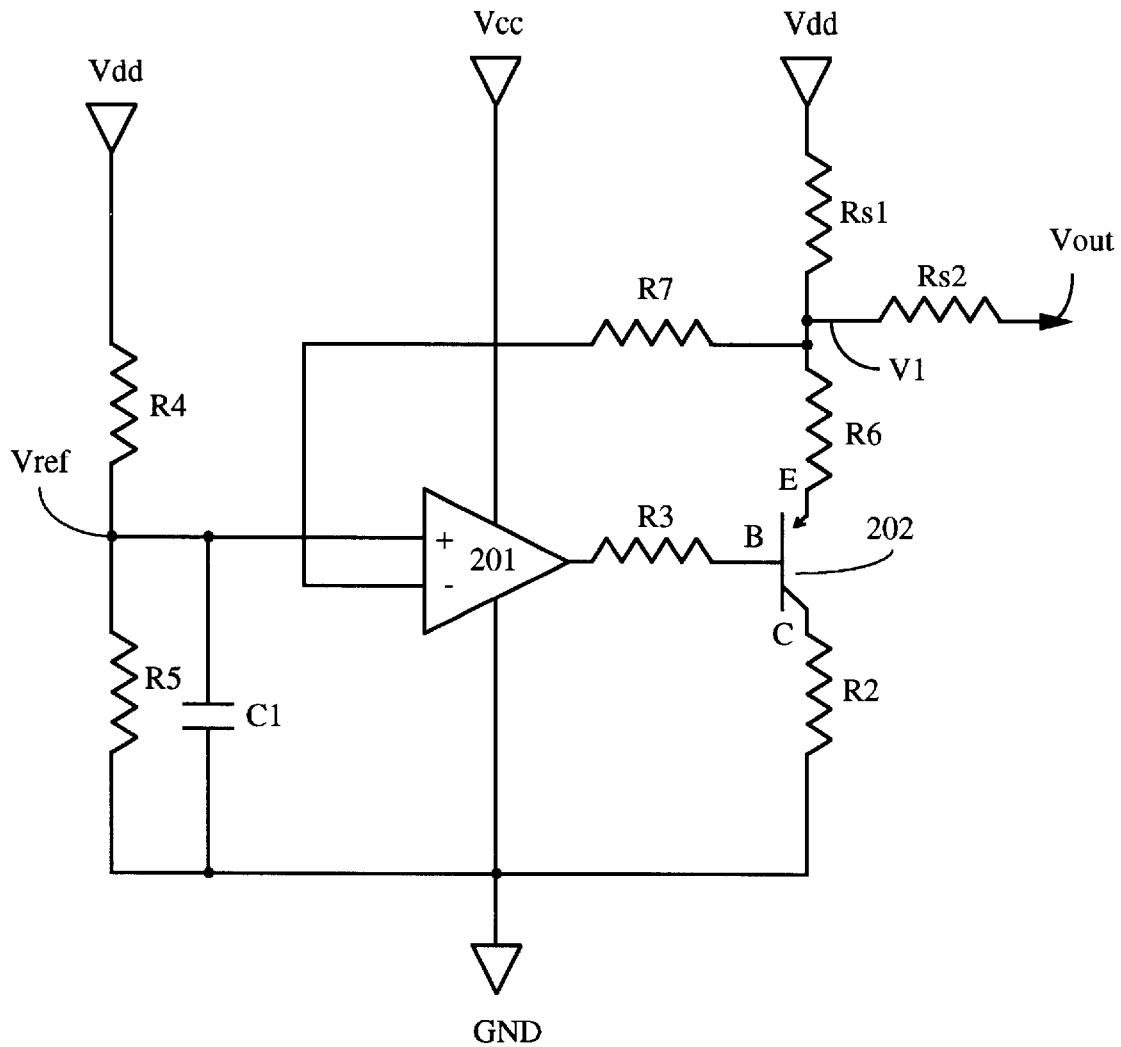
FIG. 2 shows an active shunt filter in accordance with one embodiment of the present invention.

FIG. 2 shows an active shunt filter 200 in accordance with one embodiment of the present invention. The active shunt filter 200 includes an op amp 201 and a PNP transistor 202. The output of op amp 201 is coupled to the base of transistor 202 via resistor R3. The positive input of op-amp 201 is coupled to Vdd (3.3 volts) via R4 and is coupled to ground GND via resistor R5. The negative input of op amp 201 is coupled to the emitter of transistor 202 via resister R7. Op amp 201 is coupled to receive power from Vcc (5.0 volts). The emitter of transistor 202 is coupled to Vdd via resistor Rs1 and resistor R6, and the collector of transistor 202 is coupled to GND via resistor R2. The voltage at the positive input of op amp 201 is referred to as Vref. The voltage at the circuit node between Rs1 and R6 is referred to as V1. Resistor Rs2 couples to V1 to produce the voltage Vout.

The active shunt filter 200 functions by actively compensating for variation in the voltage level of Vdd. In essence, active shunt filter 200 tracks the voltage level of Vdd while actively countering variations in Vdd which are at frequencies above the designed −3 dB point (i.e., 3 Hz for a typical PLL application). The active shunt filter 200 actively counters variations in Vdd by precisely controlling a shunt current which flows from Vdd via Rs1. This shunt current flows through Rs1 and R6 and transistor 202. The majority of the shunt current flows to GND via R2, with the remainder of the shunt current flowing out of the base of transistor 202 and into op amp 201. The transistor 202 regulates the flow of the shunt current. Op amp 201 precisely controls the shunt current by precisely controlling transistor 202. The negative input of Op amp 201 "sees" V1 via R7. The positive input of op amp 201 sees Vref. Thus, the difference between Vref and V1 controls the output of op amp 201, the output of op amp 201 controls the impedance of transistor 202, and hence, controls the shunt current. The resulting voltage V1 is coupled via Rs2 to the conventional filters of an external PLL circuit as Vout. In this manner, active shunt filter 200 maintains a very stable and noise free Vout power supply. Vout tracks variations in Vdd at frequencies lower than the designed −3 dB point (e.g., 3 Hz) while greatly attenuating frequencies above the designed −3 dB point.

Vref is dictated by the resistance/capacitance (RC) relationship of R4, R5, and C1. Thus, the frequency response characteristics of active shunt filter 200 can thus be adjusted by altering the RC characteristics of R4, R5, and C1 using well known and widely used equations (discussed below). Altering the resistance of the resistors Rs1, Rs2, R7, R2, R3, and R6 also effects changes in the frequency response characteristics of active shunt filter 200. In addition, since active shunt filter 200 is uses an active noise compensation technique, the open loop gain bandwidth of op amp 201 greatly affects the frequency response characteristics.

The active shunt filter 200 of the present invention is capable of attenuating noise at much lower frequencies than possible using the prior art cascaded capacitor filter, and much higher frequencies than prior art active DC regulators. Since active shunt filter 200 uses active compensation techniques as described above, a high frequency op amp can be selected for use as op amp 201. The high frequency op amp is be able to respond to variations at V1 at very high frequencies. Using such an op amp, active shunt filter 200 will continue to attenuate frequencies as they increase until the open loop gain bandwidth of op amp 201 is exhausted.

The active shunt filter 200 also has the characteristic of being very robust. This shunt current, as described above, flows through Rs1 and R6 and transistor 202. The majority of the shunt current flows to GND via R2, with the remainder of the shunt current flowing out of the base of transistor 202 and into op amp 201. R6 and R2 dissipate the majority of power from the shunt current. Resisters R6 and R2 are relatively inexpensive and are easily selected so as to optimize their power dissipation characteristics. In contrast to other prior art active filtering techniques, the circuits of op amp 201 are not required to dissipate large amounts of power. Thus, op amp 201 is not subjected to the heating effects of constantly shunting current. As such, the reliability of active shunt filter 200 is increased and more sensitive, higher bandwidth op amps can be selected for use as op amp 201.

The active shunt filter 200 also mitigates the detrimental effects of the power supply inductance and parasitic resistance present in Vdd. By providing a constant shunting current, V1 is never "starved" of current. This allows transistor 202 to maintain a very solid V1, greatly reducing noise. To actively compensate for variation in Vdd, the constant shunting current provides a near instantaneous source of current, as opposed to having to draw current through the supply inductance and parasitic resistance effects of Vdd.

The active shunt filter 200, as described above, tracks Vdd variations which occur below the designed −3 bd point. In this manner, active shunt filter 200 is dissimilar to typical DC voltage regulator circuits which perform a some what analogous function. The active shunt filter 200 is intentionally designed to track such Vdd variations in order to avoid introducing a potential source of latchup. In the mixed signal ASIC environments in which active shunt filter 200 may be used, it is important that differing power supply voltage levels are tightly controlled to avoid inducing a latch up condition in any CMOS transistors. The voltage difference threshold at which latchup can occur is referred to as the latchup threshold. If Vout from active shunt filter 200 were allowed to independently drift, there would be a significant possibility of inducing latchup. The active shunt filter 200 of the present invention, however, is designed to track any drift caused by thermal effects, any float due to loading, or any other such variation. These Vdd effects are typically manifested at frequencies below the designed −3 dB point of the active shunt filter 200 and are thus tracked. In contrast, a typical DC voltage regulator might allow Vdd to depart significantly from Vout, allowing the PLL of a circuit to run at significantly different voltages than the rest of the circuit, and hence, risking latchup.

In this manner, the active shunt filter 200 provide noise attenuation at higher frequencies than can be affected by conventional DC regulators, while not requiring DC reregulation. In order to prevent Vdd from significantly departing Vout, the DC voltage regulator requires the use of DC servo control circuitry. The active shunt filter of the present invention closely tracks Vdd, in the manner described above, without the use of such servo control circuitry.

The active shunt filter 200 of the present invention continues to provides power to the external PLL circuit in the event active shunt filter 200 is "off" or otherwise inactive. If Vcc is shut off (i.e., zero volts), power will still be available to the PLL via Vdd. The transistor 202 will be off (i.e., at a very high impedance) and the shunt circuit from Vdd to GND will be fully open. Vdd will supply power to the PLL via Rs1 and Rs2. In this manner, the external PLL circuit can continue to operate, drawing power directly from Vdd. While inactive, active shunt filter 200 does not filter Vdd, however, Vdd is still filtered by the conventional PLL filter coupled between active shunt filter 200 and the external PLL circuit.

In contrast, in a prior art voltage follower regulator circuit, power is not supplied to Vout when the prior art voltage regulator circuit is inactive. The prior art voltage regulator circuit uses a collector coupled pass transistor to supply current to Vout. The current supplied to the external PLL circuit flows through the pass transistor and the impedance of the pass transistor is controlled by an op amp. Thus, when this op amp is inactive, current to Vout is cut off. The active shunt filter 200 of the present invention uses an emitter coupled transistor to shunt current away from Vout, as described above. As a result, Vout can be much more precisely controlled and current is not cut off when op amp 201 is inactive.

It should be appreciated that resister R7 of the active shunt filter 200 is an optional resister. R7 is sized to equal the parallel resistance of Rs1 and Rs2. R7 is included to improve the stability of op amp 201. In addition, R7 is intended to help compensate for current leakage in op amp 201.

It should be appreciated that the resistor Rs2 is an optional resistor. In the present embodiment, Rs2 is included to provide a precisely controlled equivalent series resistance with regard to the circuits coupled to receive Vout from active shunt filter 200. The value of the resistance of Rs2 is selected to properly interface active shunt filter 200 with the external PLL circuit.

In addition, it should be appreciated that R6 is an optional resistor. The resistor R6, in some implementations, can improve the stability of active shunt filter 200. In the active shunt filter 200 of the present invention, R6 shares the power dissipation load from the shunt current with R2. The active shunt filter 200, however, is well suited for operation without R6, such that the majority of the load from the shunt current is dissipated in R2. In some applications, all power can be dissipated in transistor 202.

Figure 3:
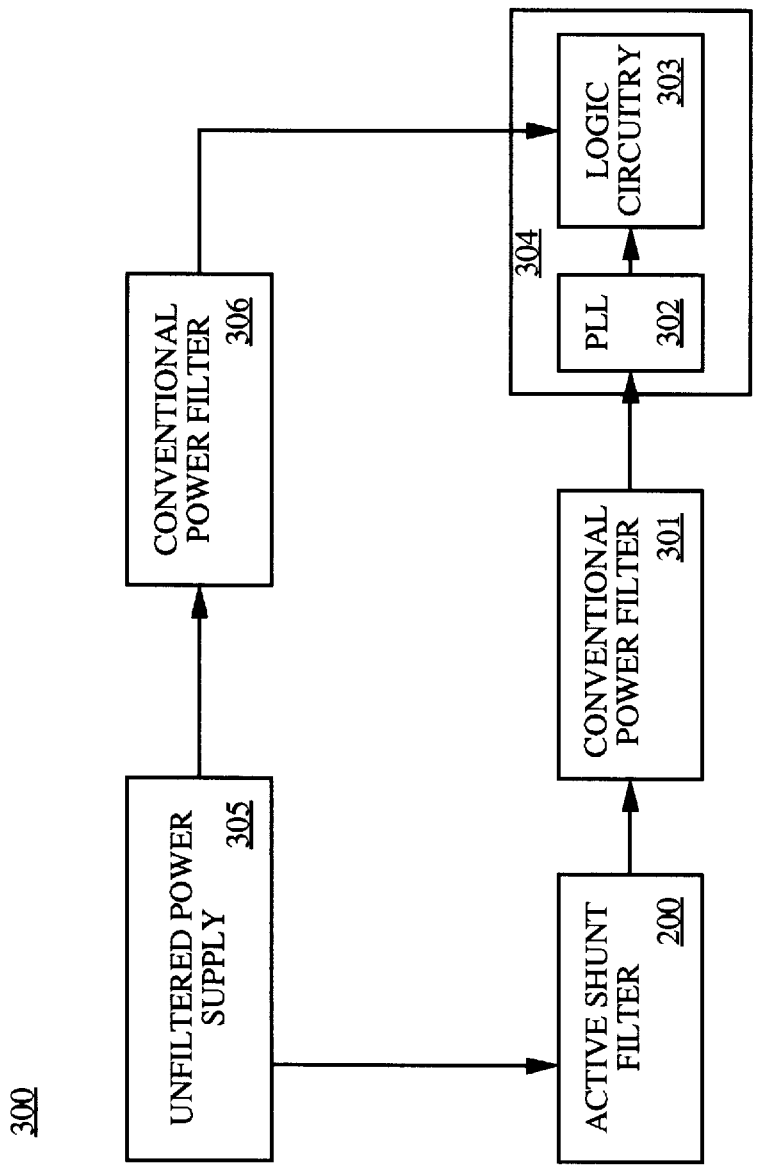
FIG. 3 shows a diagram of a system incorporating the active shunt filter of the present invention.

With reference now to FIG. 3, a diagram of a system 300 incorporating the active shunt filter 200 of the present invention is shown. The active shunt filter 200 is coupled to a conventional power filter 301. A PLL circuit 302 is coupled to logic circuitry 303. Both the PLL circuit 302 and the logic circuitry 303 are incorporated within a mixed signal ASIC 304. Logic circuitry 303 is coupled to receive power directly from unfiltered power supply 305 via a conventional power filter 306. The unfiltered power supply 305 also supplies power to active shunt filter 200. Due to its sensitivity to noise, the PLL circuit 302 receives power from active shunt filter 200 via conventional power filter 301. Thus, the power supplied to PLL circuit 302 is first filtered by active shunt filter 200 and subsequently filtered by the conventional power filter 301. The conventional power filter 301 is a prior art cascaded capacitor filter optimized to function with active shunt filter 200.

Figure 4:
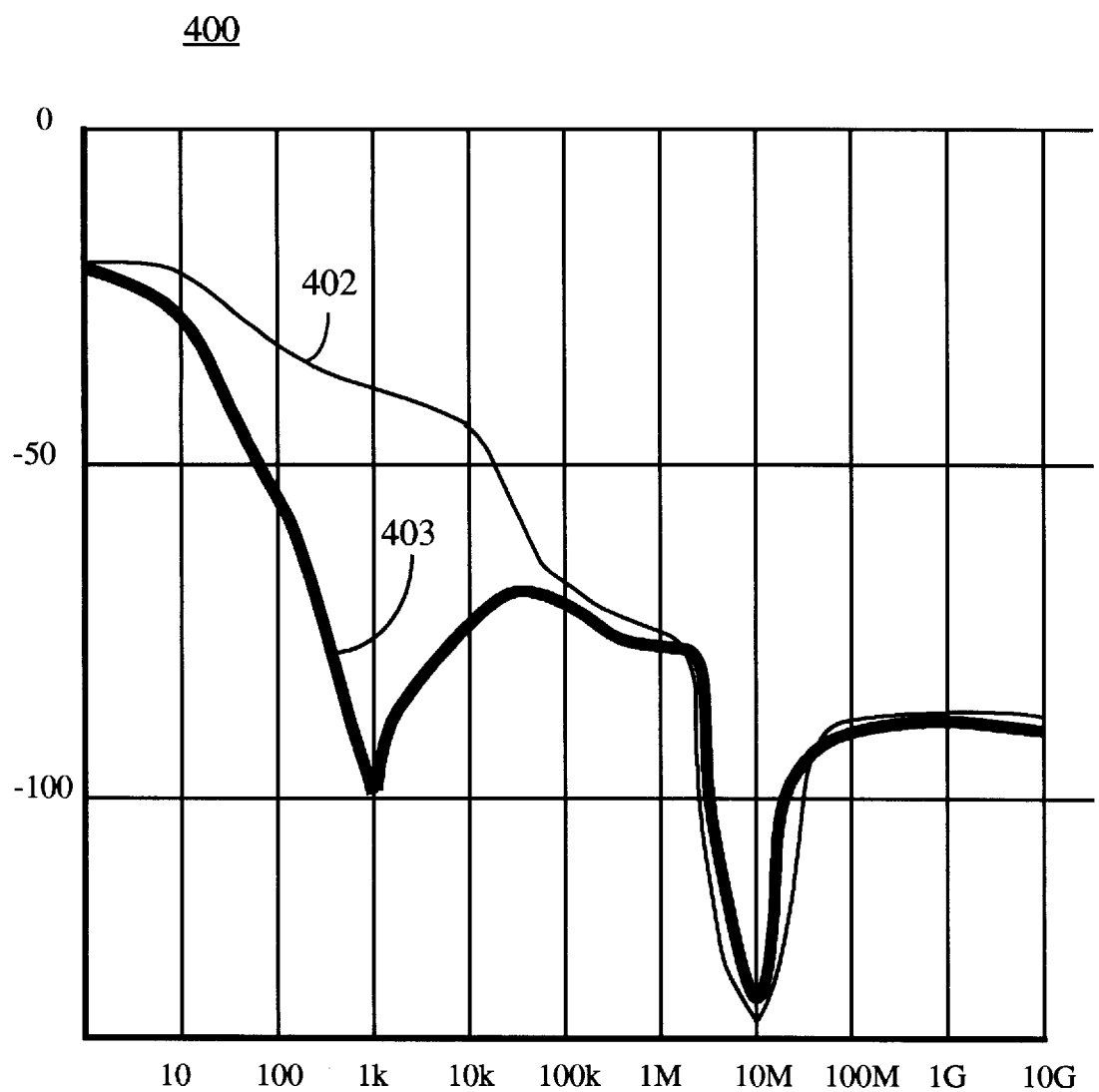
FIG. 4 shows a frequency response graph illustrating the frequency response of one embodiment of the active shunt filter in comparison to the frequency response of the conventional power filter.

FIG. 4 shows a frequency response graph 400 illustrating the frequency response of one embodiment of the active shunt filter 200 in comparison to the frequency response of the conventional power filter 301. The frequency response of active shunt filter 200 is represented by line 401. The frequency response of the conventional power filter 301 is represented by line 402. The vertical axis of graph 400 shows noise magnitude in dB volts. The horizontal axis of graph 400 shows frequency.

In the present embodiment, the parallel combination of R4 and R5 equals 11.4K ohms and the capacitance of C1 equals 4.7 $\mu$F. The −3 dB point of active shunt filter 200 is governed by the equation:

$$F = 1/2\pi(R4||R5)C_1$$

where the expression (R4||R5) represents the parallel resistance of R4 and R5.

Hence, the −3 dB point of active shunt filter 200 is approximately 2.97 Hz, as is reflected by line 401. It should also be appreciated that at the maximum attenuation point of active shunt filter 200, the attenuation is approximately −72 dB greater than the conventional power filter 301 at the same frequency. This is more than 3 orders of magnitude greater attenuation than the conventional power filter 301 at the same frequency. In addition, this maximum attenuation can be adjusted to occur at a much lower frequency than that of conventional power filter 301. This maximum attenuation point (i.e., notch frequency) can be adjusted along with the overall frequency response characteristics of active shunt filter 200, to be positioned at precisely the frequency of maximum noise sensitivity of PLL circuit 302 or other circuits which active shunt filter 200 supplies power, thus greatly benefiting PLL circuits or other devices which exhibit noise sensitivity at their natural frequencies. For example, PLL circuits which exhibit maximum noise sensitivity at their respective natural frequencies ($w_n$) benefit by having the active shunt filter 200 notch frequency placed at a frequency close to $w_n$.

Thus, the active shunt filter 200 of the present invention provides a circuit for filtering a power supply for noise sensitive devices which overcomes the limitations of the prior art. The active shunt filter 200 of the present invention does not require the use of large capacitors in order to filter out low frequency noise. The active shunt filter 200 does not consume a large amount of circuit board space. The present invention provides a greater amount of attenuation at the natural frequencies of noise sensitive devices than prior art cascaded capacitor filters. In addition, the active shunt filter 200 of the present invention provides noise attenuation at higher frequencies than can be affected by conventional DC regulators, while not requiring DC reregulation.

The present invention, a circuit for filtering a power supply for noise sensitive devices, is thus disclosed. While the present invention has been described in particular embodiments, it should be appreciated that the present invention should not be construed as limited by such embodiments, but rather construed according to the below claims.

What is claimed is:

1. A circuit for filtering a power supply for noise sensitive devices, comprising:

a transistor having a base, an emitter, and a collector;

a first resistor to couple said emitter to a first power supply;

a second resistor to couple said collector to a ground;

a third resistor coupled to said base;

an operational amplifier having a positive input, a negative input, and an output, said output coupled to said base to control the impedance of said transistor via said third resistor, said negative input coupled to said emitter, said op amp coupled to a second power supply and said ground to receive power;

a fourth resistor coupled between said first power supply and said positive input;

a fifth resistor coupled between said positive input and said ground; and, a capacitor coupled between said positive input and said ground such that said op amp controls a shunt current flowing from said first power supply to said ground via said transistor to produce a filtered power output for a noise sensitive device at said emitter.

2. The circuit of claim 1, further comprising a sixth resistor coupled between said first resistor and said emitter such that said negative input is coupled to the node between said sixth resistor and said first resistor.

3. The circuit of claim 1, further comprising a seventh resistor coupled between said negative input and said emitter such that said negative input is coupled to the node between said emitter and said first resistor via said seventh resistor.

4. The circuit of claim 1, further comprising an eighth resistor coupled to the node between said emitter and said first resistor such that said filtered power output is received by said noise sensitive device via said eighth resistor.

5. The circuit of claim 1, wherein said transistor is an emitter coupled PNP transistor.

6. The circuit of claim 1, wherein said first power supply is 3.3 volts and said second power supply is 5 volts.

7. The circuit of claim 1, wherein said shunt current is controlled by said op amp such that said filtered power output tracks low frequency variation in said first power supply.

8. The circuit of claim 1, further comprising a conventional power filter coupled to receive said filtered power output and said noise sensitive device coupled to receive an output from said conventional power filter.

* * * * *